United States Patent
Goebl et al.

(10) Patent No.: US 8,324,717 B2
(45) Date of Patent: Dec. 4, 2012

(54) POWER SEMICONDUCTOR MODULE WITH A HERMETICALLY TIGHT CIRCUIT ARRANGEMENT AND METHOD FOR PRODUCING SUCH A MODULE

(75) Inventors: Christian Goebl, Nürnberg (DE); Heiko Braml, Wiesenttal (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 284 days.

(21) Appl. No.: 12/384,508

(22) Filed: Apr. 6, 2009

(65) Prior Publication Data
US 2010/0090328 A1 Apr. 15, 2010

(30) Foreign Application Priority Data
Apr. 5, 2008 (DE) .................. 10 2008 017 454

(51) Int. Cl.
*H01L 23/16* (2006.01)

(52) U.S. Cl. ... 257/687; 257/690; 257/700; 257/E23.14; 257/E23.173

(58) Field of Classification Search .................. 257/687, 257/690, 700, E23.14, E23.173, E23.169, 257/E23.124, E23.127
See application file for complete search history.

(56) References Cited

U.S. PATENT DOCUMENTS

| | | | |
|---|---|---|---|
| 5,637,922 A | 6/1997 | Fillion et al. | |
| 5,856,913 A | 1/1999 | Heilbronner | |
| 6,201,696 B1 * | 3/2001 | Shimizu et al. | 361/704 |
| 7,023,078 B2 * | 4/2006 | Itoh et al. | 257/678 |
| 7,042,074 B2 * | 5/2006 | Gobl et al. | 257/678 |
| 2005/0250247 A1 | 11/2005 | Augustin et al. | |

FOREIGN PATENT DOCUMENTS

| | | |
|---|---|---|
| DE | 1 594 165 | 2/1971 |
| DE | 196 17 055 | 6/1997 |
| DE | 103 55 925 | 6/2005 |
| DE | 10 2004 021 927 | 12/2005 |
| DE | 10 2004 057 421 | 6/2006 |
| DE | 10 2007 006 706 | 8/2008 |
| DE | 10 2008 017 454 | 12/2009 |
| WO | WO 2004/086502 | 10/2004 |
| WO | WO 2005/096374 | 10/2005 |
| WO | WO 2006/067021 | 6/2006 |

* cited by examiner

*Primary Examiner* — Kevin M Picardat
*Assistant Examiner* — Paul Patton
(74) *Attorney, Agent, or Firm* — The Law Offices of Roger S. Thompson

(57) ABSTRACT

A power semiconductor module comprising a substrate, a circuit formed thereon and having a plurality of conductor tracks that are electrically insulated from one another and power semiconductor components arranged on the conductor tracks. The latter are connected in a circuit-conforming manner by a connection device, which has an alternating layer sequence of at least two electrically conductive layers with at least one electrically insulating layer between them. In this case, the substrate has a first sealing area, which uninterruptedly encloses the circuit. Furthermore, this sealing area is connected to an assigned second sealing area on a layer of the connection device by a connection layer. According to the invention, this power semiconductor module is produced by applying pressure to the substrate, to the power semiconductor components and to the connection device.

6 Claims, 5 Drawing Sheets

POWER SEMICONDUCTOR MODULE WITH A HERMETICALLY TIGHT CIRCUIT ARRANGEMENT AND METHOD FOR PRODUCING SUCH A MODULE

BACKGROUND OF THE INVENTION

1. Field of the Invention

The invention is directed to a power semiconductor module and a method for producing a power semiconductor module having a circuit therein that is hermetically tightly sealed against harsh ambient influences.

2. Description of the Related Art

Power semiconductor modules are known in accordance with German Patent No. DE 196 17 055 C1 (corresponding to U.S. Pat. No. 5,856,913), wherein so-called prepregs are disclosed for the internal insulation of the power semiconductor module. Here and hereinafter, "prepregs" shall be understood to mean various configurations of semifinished products composed of an insulating material and a plastic matrix which cure with application of pressure and/or temperature and thus form a cohesive connection with at least one connection partner.

Also known, for example from German Patent Application DE 10 2004 021 927 A1, are gel-like insulants arranged in various ways for internal insulation of power semiconductor modules. In accordance with the prior art, these power semiconductor modules have a plastic housing with outwardly leading terminal elements for load and auxiliary terminals.

German Patent No. DE 103 55 925 A1 (corresponding to U.S. Pat. No. 7,042,074), discloses connection devices composed of an alternating sequence of conductive and insulating layers for the circuit-conforming connection of the circuit of a power semiconductor module. Connection devices of this type are particularly suitable for compact constructions of power semiconductor modules.

Disc cells have likewise been known for a long time; they have at least one power semiconductor component hermetically sealed against ambient harsh influences. Disc cells of this type usually have no complex circuits, such as three-phase bridge circuits, such as are known from power semiconductor modules with plastic housings.

SUMMARY OF THE INVENTION

It is an object of the invention to provide a power semiconductor module and a method for producing a power semiconductor module, wherein the circuit of the power semiconductor module is hermetically sealed against ambient influences and wherein the circuit is at the same time accessible to a flexible configuration while being simple to produce.

If the power semiconductor module is intended for use in a harsh environment, it is also preferred if it is protected against high temperature fluctuations, especially in moist environments.

The inventive power semiconductor module includes a substrate having conductor tracks arranged on the substrate, power semiconductor components arranged on the tracks and a connection device arranged with respect thereto. In this case, the "circuit" is understood to mean the totality of all the conductor tracks and semiconductor components required for the desired operation of the module. An alternating layer sequence of at least two electrically conductive layers and at least one electrically insulting layer serves as a connection device herein. The conductor tracks of the circuit are formed on the substrate and are electrically insulated from one another. They carry the power semiconductor components and form some of the circuit-conforming connections of the power semiconductor components. The further circuit-conforming connections are formed by means of the connection device. For this purpose, at least one of the electrically conductive layers is inherently structured and forms connection tracks. It may likewise be preferred for plated-through holes to be provided between different electrically conductive layers.

According to an embodiment of the invention, the substrate has a first sealing area, which uninterruptedly encloses the circuit. The sealing area can be configured as a frame around the circuit and be formed by way of example as a metallic layer analogously to the conductor tracks or as a free area on the substrate. This first sealing area is hermetically tightly connected to an assigned second sealing area of the connection device, either on a metallic layer or an insulating layer, by means of a connection layer. This connection is preferably formed as by a pressure sintering connection.

The term "pressure sintering connection" shall be understood not only as the known connection of two metals by means of a sintering metal but also as the electrically insulating connection with a prepreg instead of the sintering metal, wherein the temperature and pressure conditions during the formation of the connection correspond to those during the formation of a known pressure sintering connection by means of sintering metal.

The inventive method for forming a power semiconductor module of this type is characterized by the following steps:

arranging the power semiconductor components on the assigned conductor tracks of the substrate, wherein it is preferred here to arrange a sintering metal layer between the respective power semiconductor component and the assigned area on the conductor track;

arranging the connection layer, for example embodied as a sintering metal layer or as a prepreg, on the first sealing area;

arranging the connection device with respect to the power semiconductor components, with respect to the first sealing area and with respect to the substrate; it will be understood by one of ordinary skill in the art that the second sealing area is also oriented with respect to the connection layer and hence also with respect to the first sealing area; and applying pressure and, preferably, also temperature, to the substrate, to the power semiconductor components and to the connection device, whereby the pressure sintering connection between the first and second sealing areas is formed.

It may be particularly preferred here if, after the arrangement of the power semiconductor components, a gel-like insulant, for example a silicone gel, is arranged completely around them and circumferentially on the edge of the main area remote from the substrate.

Particularly preferred developments of this circuit are mentioned in the respective descriptions of the exemplary embodiments.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless

DETAILED DESCRIPTION OF THE PRESENTLY PREFERRED EMBODIMENTS

Figure 1:
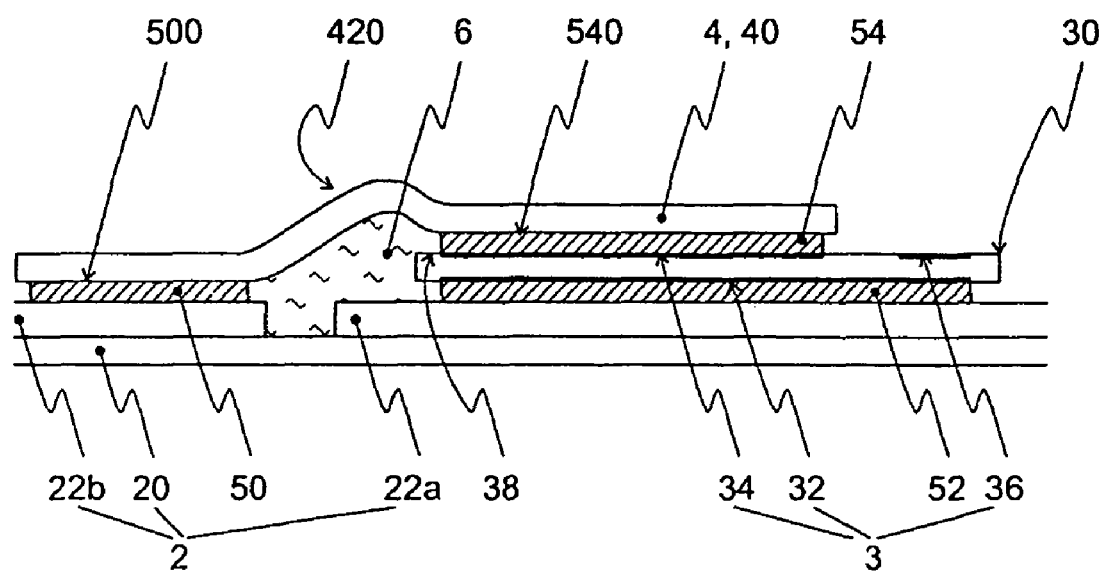
FIG. 1 is a side view of a portion of a prior art power semiconductor module with a connection device.

FIG. 1 shows a side view of a prior art power semiconductor module having a connection device 4. An illustration of the housing and of the necessary external load and auxiliary terminal elements is omitted for clarity here and in all the following figures. FIG. 1 also shows a substrate 2 such as is often known as a so-called DCB (direct copper bonding) or IMS (insulated metal substrate) substrate, without this intending to signify a restriction to such substrates. Substrate 2 has an insulating layer 20 with conductor tracks 22a/b that are arranged thereon and electrically insulated from one another. One of said conductor tracks 22a here carries an unpackaged semiconductor component 3, for example a power transistor such as is used for example for driving three-phase motors.

A first sintering metal layer 52 connects first conductor track 22a carrying semiconductor component 3 and an assigned contact area 32 on the first main area of semiconductor component 3. After the pressure sintering process in production, sintering metal layer 52 provides a highly reliable electrically conductive connection.

The second main area of semiconductor component 3 has two contact areas 34, 36: a first, large-area emitter terminal area 34 and a second, smaller gate terminal area 36. A second sintering metal layer 54 is in turn arranged on the emitter terminal area 34. Sintering metal layer 54 connects emitter terminal area 34 to connection device 4.

In this embodiment, connection device 4 is a metallic film 40, preferably made of copper with a noble metal coating in the region of sintering connections 50, 52. The thickness of metallic film 40 is chosen in such a way that it has at least the same current-carrying capacity as a wire bonding connection in accordance with the prior art.

Connection device 4 constitutes the electrically conductive connection between the emitter terminal area 34 of semiconductor component 3 and second conductor track 22b of substrate 2. The connection of the connection device 4 to second conductor track 22b is likewise embodied as a pressure sintering connection. Metallic film 40 preferably has an arcuate course 420 between the two contact areas.

An insulant 6 is arranged in the volume formed by the arcuate course 420 of connection device 4, substrate 2 and semiconductor component 3. Insulant 6 was applied during the production process in that region which is subsequently covered by connection device 4. In this embodiment, this is the region alongside a lateral edge 30 of semiconductor component 3 and also an outer part of the upper edge 38, cf. FIG. 2.

Insulant 6 is preferably a multicomponent silicone compound that was applied in a metering or casting method, at the edge of semiconductor component 3 and was crosslinked by means of UV exposure. Consequently, firstly a degree of toughness is imparted to insulant 6, and secondly such a silicone compound is also suitable for internal electrical insulation if the circuit was designed for correspondingly high voltages.

Figure 2:
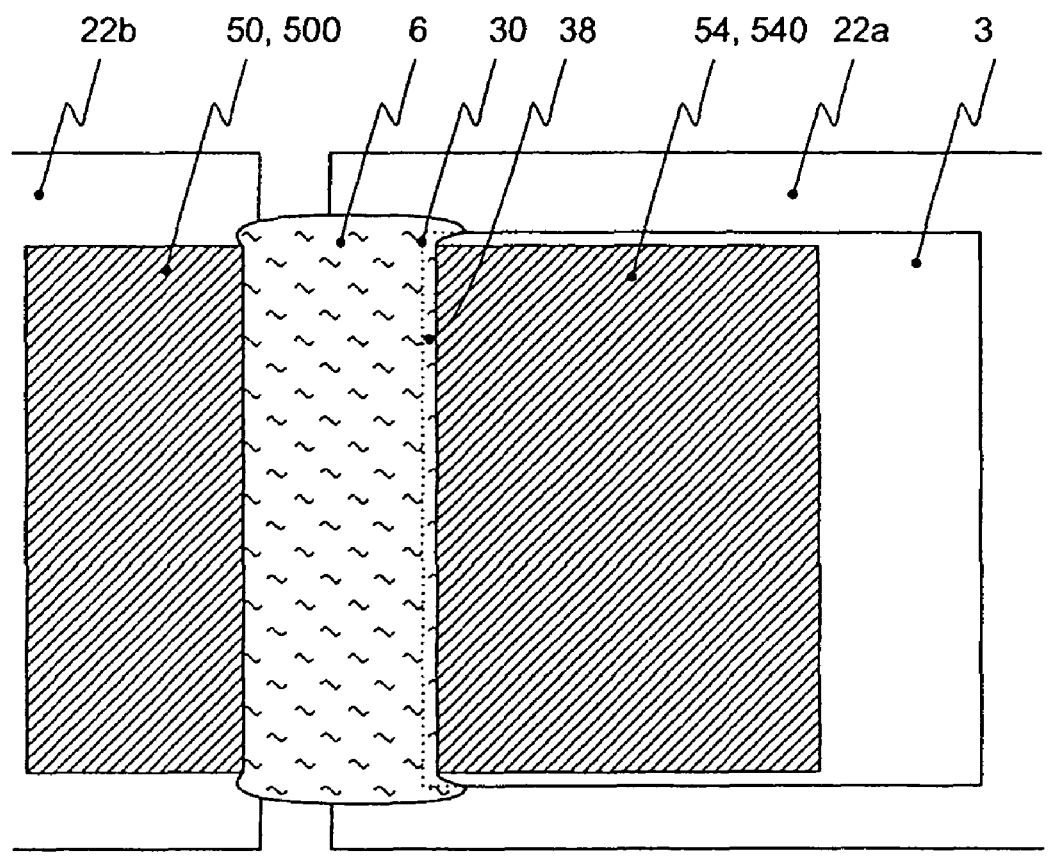
FIG. 2 is a plan view of a portion of a prior art power semiconductor module with a connection device.

FIG. 2 shows a plan view of a portion of a prior art power semiconductor module with a connection device. Here, the illustration shows the same parts of the circuit as described with respect to FIG. 1.

FIG. 2 shows the areal extent of insulant 6 in the region between contact areas 500, 540 of connection device 4 with conductor track 22b and also semiconductor component 3 or emitter terminal area 34 thereof and also in the region alongside connection device 4.

In accordance with this embodiment, insulant 6 firstly serves, in the case of pressure being introduced in the area of the pressure sintering connection in the direction of the plane of the drawing, as a quasi-hydrostatic element that distributes the pressure uniformly among its interfaces and thus prevents damage to the semiconductor component during the application thereof. Secondly, it also serves for the already described electrical insulation of the circuit of the inventive power semiconductor module.

Figure 3:
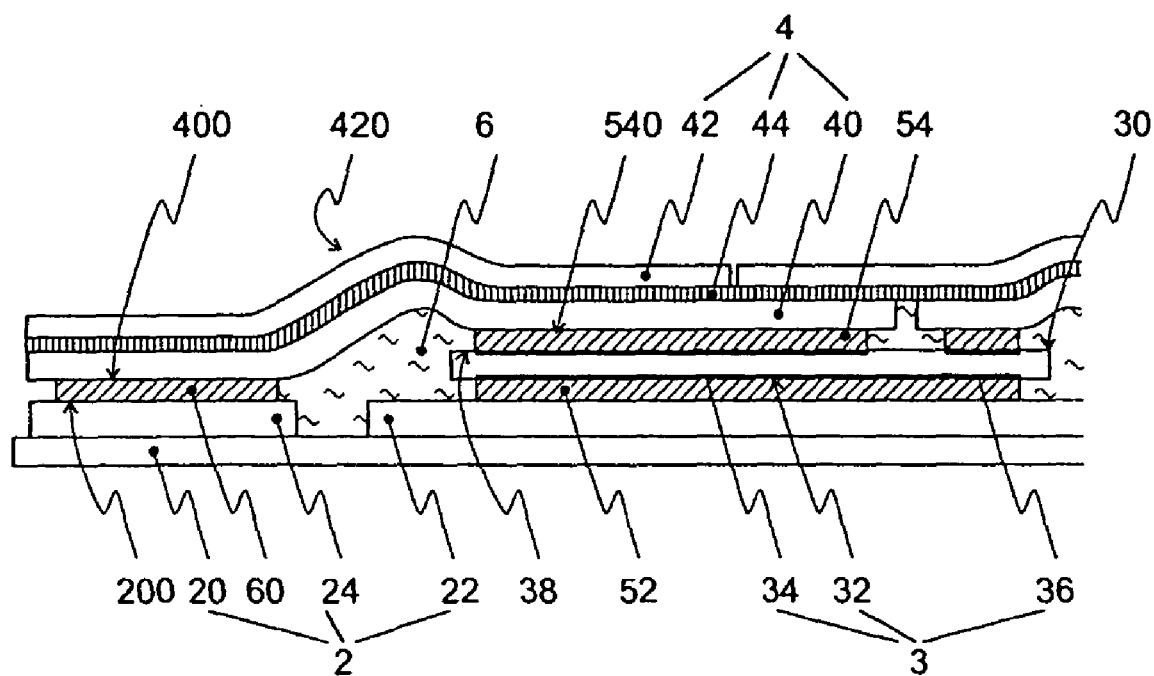
FIG. 3 is a side view of a portion of a first embodiment of the inventive power semiconductor module.

FIG. 3 is a side view of a first configuration of the inventive power semiconductor module. The basic construction of substrate 2, and of power semiconductor component 3 arranged on conductor track 22, is identical to the prior art, as described with respect to FIG. 1. In FIG. 3, however, connection device 4 has an alternating construction composed of at least three layers, wherein the layer sequence begins, as viewed from substrate 2, with a first electrically conductive layer 40, which is followed by a first insulating layer 44 and then a conductive layer 42 again. In this embodiment, connection device 4 extends over the entire circuit and beyond first sealing area 200, cf. FIG. 6.

According to the invention, substrate 2 has a sealing area 200 formed only circumferentially around the circuit, sealing area 200 being arranged on a metallic layer 24 formed analogously to conductor tracks 22. In accordance with the inventive method, a sintering metal layer 60 is arranged on the first, here metallic, sealing area 200, sintering metal layer 200 being connected to a second sealing area 400, which here is arranged on first conductive layer 40 of the connection device 4, via pressure sintering. In order to form these sintering connections, it is preferred to provide the connection partners, that is to say first sealing area 200 and second sealing area 400, with a noble metal coating. It is particularly preferred to form a plurality of sintering connections simultaneously in one work step, that is to say the sintering connections of the two sealing areas 200, 400 and also the sintering connections of power semiconductor component 3, namely the connection to assigned conductor track 22 and to first metallic layer 40 of connection device 4.

The illustration furthermore shows that a gel-like insulant 6 is arranged circumferentially around respective power semiconductor components 3, advantageously as far as first sealing area 200. Insulant 6 not only encloses power semiconductor component 3 at its outer edge 30 but also covers that main area of component 3 which is remote from substrate 2, at edge 38 thereof.

Figure 4:
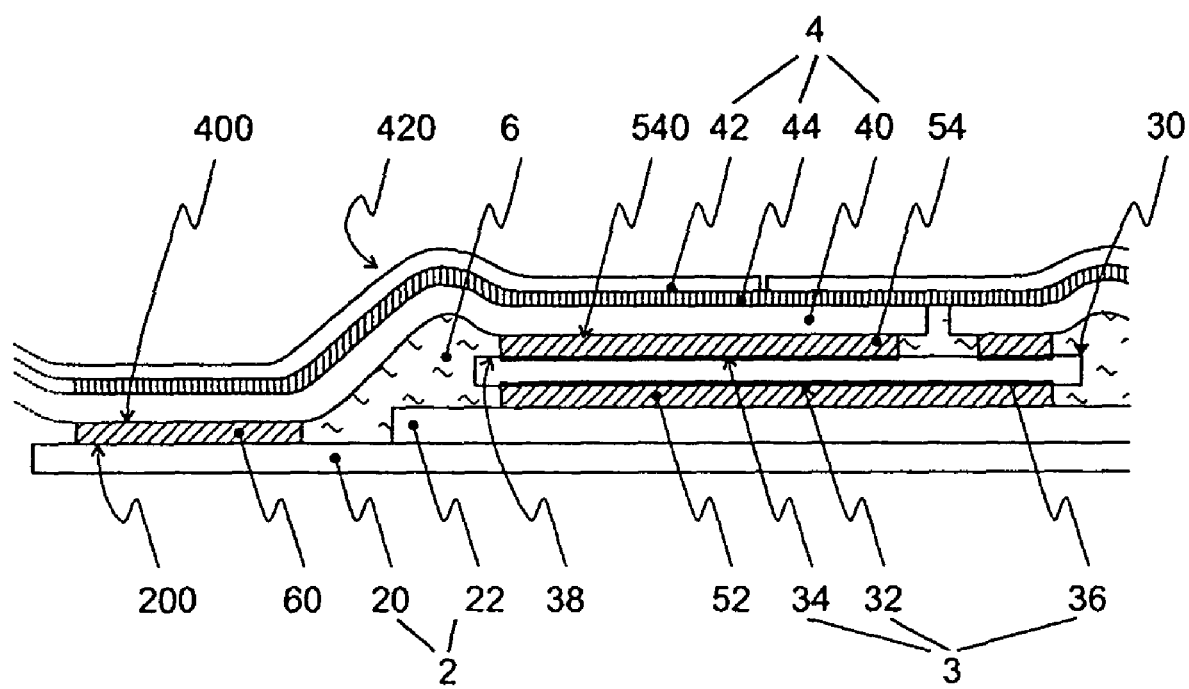
FIG. 4 is a side view of a portion of a second embodiment of the inventive power semiconductor module.

FIG. 4 is a side view of a portion of a second embodiment of the inventive power semiconductor module. This embodiment of power semiconductor component 3 and the construction of connection device 4 are substantially identical to that described with respect to FIG. 3. Here, however, the connection device at least partly projects further beyond first sealing area 200 at the side remote from power semiconductor component 3, for example to be connected to terminal elements (not shown) for external load and auxiliary terminals.

Here, however, as with first sealing area 200, substrate 2 does not have a metallic layer but rather exclusively a recessed region of basic body 20 of substrate 2 that completely encloses the circuit, that is to say a region on the ceramic in the case of a DCB substrate.

In this embodiment, sintering metal can then again be used as connection layer 60, in which case, however, a noble metal coating would then have to be deposited on the respective sealing area 200, 400. Alternatively, and preferably, a prepreg is used here as the connection layer 60, said prepreg being arranged around the circuit in a frame-like manner and thus completely enclosing the circuit (cf. FIG. 6). In the context of the sintering connections of power semiconductor component 3, here the connection of prepreg 60 to first sealing area 200 and second sealing area 400 is also created at the same time, wherein the second sealing area 400 is again a partial area of first electrically conductive layer 40 of connection device 4.

Figure 5:
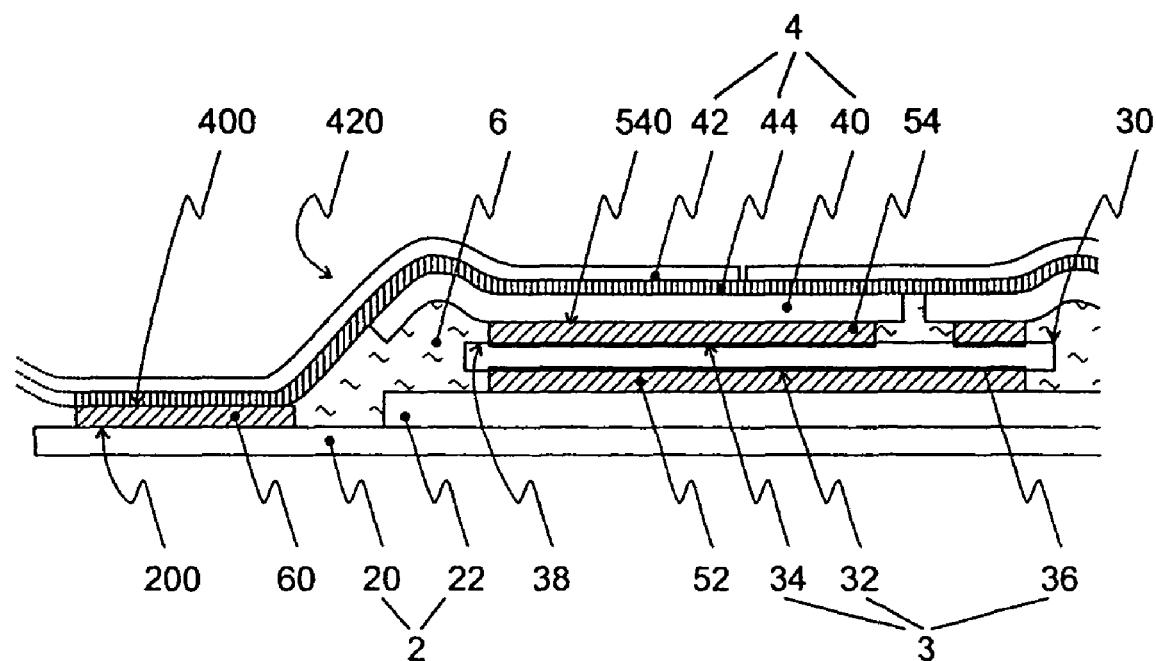
FIG. 5 is a side view of a portion of a third embodiment of the inventive power semiconductor module.

FIG. 5 is a side view of a third embodiment of the inventive power semiconductor module. This embodiment differs from the second embodiment shown in FIG. 4 in that second sealing area 400 is a partial area of first insulating layer 44 of connection device 4. Here, connection layer 60 is advantageously embodied as a prepreg.

Figure 6:
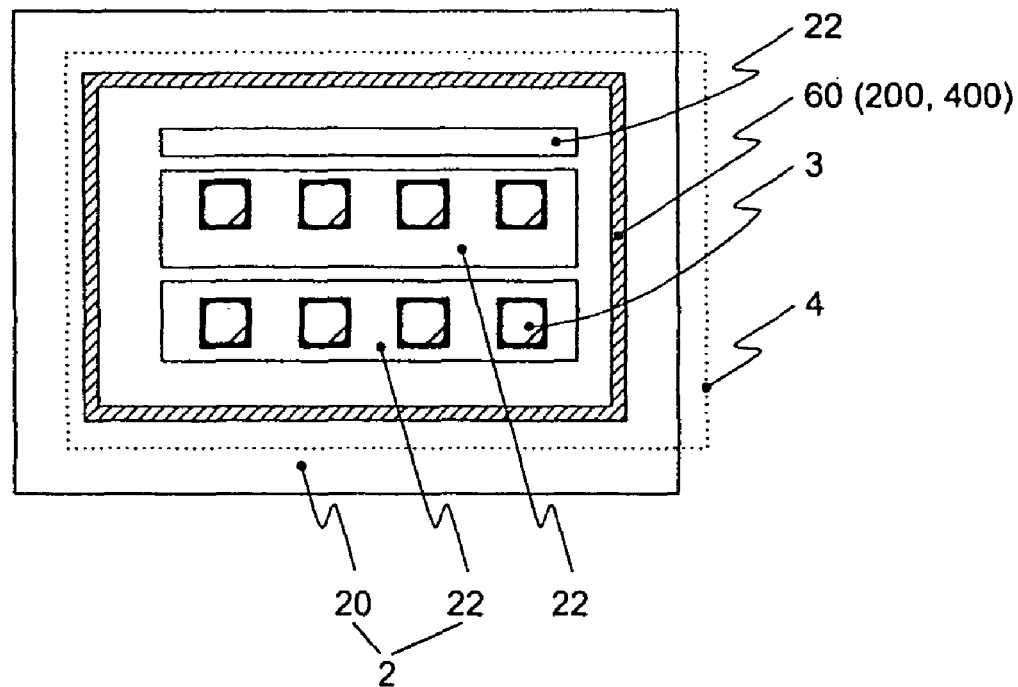
FIG. 6 is a plan view of a substrate of the inventive power semiconductor module.

FIG. 6 is a plan view of a substrate 2 of the inventive power semiconductor module. FIG. 6 shows substrate 2 with the circuit comprising three conductor tracks 22 and power semiconductor components 3 arranged on two of the conductor tracks. The illustration likewise schematically shows connection layer 4, which is congruent with circumferential first sealing area 200 on substrate 2 and second sealing area 400 on connection device 4.

The circuit-conforming connection of the power semiconductor components 3 to one another or to a further conductor track 22 is effected by connection device 4, only the contour of which is illustrated. As would be appreciated by one of ordinary skill in the art, the inventive device projects over the entire circuit and first sealing area 200 to achieve a hermetically tight seal of the circuit with respect to ambient influences.

Figure 7:
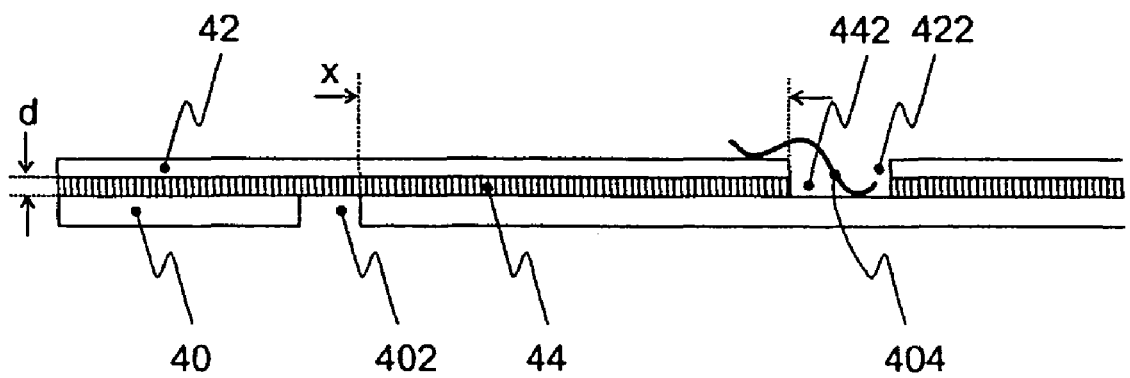
FIG. 7 is a side view of a portion of a first embodiment of a connection device of the inventive power semiconductor module.

FIG. 7 depicts a portion of a first embodiment of a connection device 4 of the inventive power semiconductor module. Here, FIG. 7 shows a through contact-connection 404 from the interrupted (422) second electrically conductive layer 42 through a cutout 442 in insulating layer 44 to first electrically conductive layer 40. This is embodied here as a wire bonding connection 404. FIG. 7 likewise shows an interruption 402 of first electrically conductive layer 40, for example for producing two mutually insulated connection tracks for the emitter terminal and the gate terminal of a power semiconductor component, cf. FIGS. 3 to 5.

For hermetically sealing the circuit, it may be necessary not only to connect the circumferential first and second sealing areas to one another but also to provide a distance x between openings 402, 422 of electrically conductive layers 40, 42. It is particularly preferred, therefore, if two openings 40, 42 of this type are at a distance x from one another which comprises at least ten times the thickness d of insulating layer 44 arranged between electrically conductive layers 40, 42.

Figure 8:
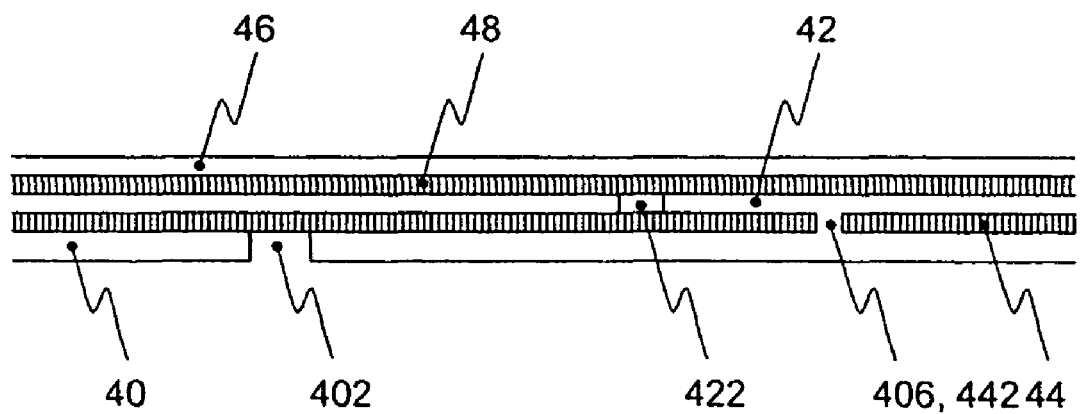
FIG. 8 is a side view of a portion of a second embodiment of a connection device of the inventive power semiconductor module.

FIG. 8 shows a portion of a second embodiment of connection device 4 of the inventive power semiconductor module. FIG. 8 shows a connection device comprising three electrically conductive layers 40, 42, 46 and two insulating layers 44, 48 respectively arranged between them. The first and second electrically conductive layers 40, 42 have plated-through holes 406 for circuit-conforming connection, while the third electrically conductive layer 46 is not interrupted and can serve for example for screening the circuit.

Each of the individual layers of this connection device but particularly also the third, uninterrupted electrically conductive layer 46 is suitable for arranging the second sealing area 400 thereon.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. A power semiconductor module comprising:
   a substrate;
   a circuit formed on said substrate and including a plurality of conductor tracks that are electrically insulated from one another and power semiconductor components arranged on said conductor tracks;
   a connection device to connect, in a circuit-conforming manner, said components and said tracks;
   at least two electrically conductive layers; and
   at least one electrically insulating layer disposed between said two electrically conductive layers;
   wherein said substrate has a first sealing area, which uninterruptedly encloses said circuit and a connection layer that connects said sealing area to an assigned second sealing area on a layer of said connection device; and
   wherein said first sealing area is arranged on a metallic layer and is hermetically tightly connected to at least one of said electrically conductive layers of said connection device by a pressure sintering connection and wherein said connection layer comprises a sintering metal.

2. A power semiconductor module of claim 1, comprising:
   a substrate;
   a circuit formed on said substrate and including a plurality of conductor tracks that are electrically insulated from one another and power semiconductor components arranged on said conductor tracks;
   a connection device to connect, in a circuit-conforming manner, said components and said tracks;
   at least two electrically conductive layers; and at least one electrically insulating layer disposed between said two electrically conductive layers;

wherein said substrate has a first sealing area, which uninterruptedly encloses said circuit and a connection layer that connects said sealing area to an assigned second sealing area on a layer of said connection device; and wherein said first sealing area is formed on at least one of a metallic layer and an insulating area of said substrate and is hermetically tightly connected to said second sealing area by a pressure sintering connection and wherein said connection layer is a prepreg.

3. The power semiconductor module of claim 1, wherein said second sealing area is formed on one of a conductive layer and an insulating layer of the connection device.

4. The power semiconductor module of claim 1, further comprising:

a gel-like insulant arranged circumferentially around said power semiconductor components.

5. The power semiconductor module of claim 2, wherein said second sealing area is formed on one of a conductive layer and an insulating layer of the connection device.

6. The power semiconductor module of claim 2, further comprising: a gel-like insulant arranged circumferentially around said power semiconductor components.

* * * * *